(12) United States Patent
Gururaja

(10) Patent No.: US 6,467,140 B2
(45) Date of Patent: Oct. 22, 2002

(54) METHOD OF MAKING COMPOSITE PIEZOELECTRIC TRANSDUCER ARRAYS

(75) Inventor: Turukevere R. Gururaja, North Andover, MA (US)

(73) Assignee: Koninklijke Philips Electronics N.V., Eindhoven (NL)

( * ) Notice: Subject to any disclaimer, the term of this patent is extended or adjusted under 35 U.S.C. 154(b) by 0 days.

(21) Appl. No.: 09/754,980

(22) Filed: Jan. 5, 2001

(65) Prior Publication Data

US 2001/0050514 A1 Dec. 13, 2001

Related U.S. Application Data

(62) Division of application No. 08/292,634, filed on Aug. 18, 1994, now Pat. No. 6,225,728.

(51) Int. Cl.[7] .............................................. A04R 17/00
(52) U.S. Cl. ..................... 29/25.35; 310/357; 310/358
(58) Field of Search .................... 29/25.35; 310/357, 310/358

(56) References Cited

U.S. PATENT DOCUMENTS

| 3,750,243 | A | * | 8/1973 | Prentice ..................... 29/25.35 |
| 4,398,325 | A | * | 8/1983 | Piaget et al. ................ 29/25.35 |
| 4,514,247 | A | * | 4/1985 | Zola ........................... 29/25.35 |
| 4,572,981 | A | * | 2/1986 | Zola ........................... 29/25.35 |
| 5,357,662 | A | * | 10/1994 | Takagi et al. ............... 29/25.35 |
| 5,539,965 | A | * | 7/1996 | Safari et al. ................ 29/25.35 |
| 5,545,959 | A | * | 8/1996 | Jeon ........................... 29/25.35 |
| 5,722,137 | A | * | 3/1998 | Lorraine et al. ............ 29/25.35 |

* cited by examiner

*Primary Examiner*—Carl J. Arbes
(74) *Attorney, Agent, or Firm*—John Vodopia

(57) ABSTRACT

Transducer elements having a 2—2 or 1–3 composite structure and driven in a $k_{31}$ transverse mode for small-feature size transducer arrays, which provide improved electrical impedance matching to an ultrasonic imaging system and improved acoustic matching to the human body. The transducer element includes a plurality of thin piezoceramic wafers which are electroded on opposing major surfaces. The spaced wafers are separated by a passive polymer layer in a composite structure. Methods of producing the transducer elements are also described.

5 Claims, 11 Drawing Sheets

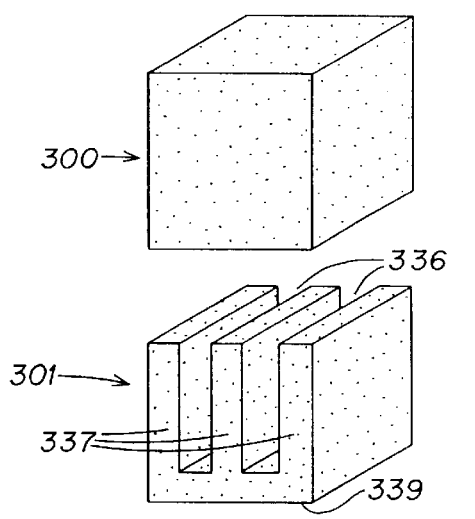
FIG. 11A
FIG. 11B
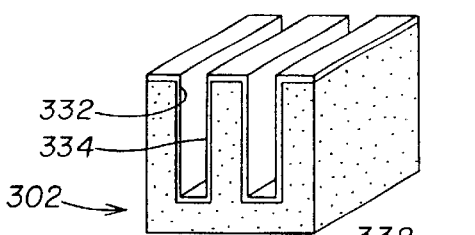
FIG. 11C
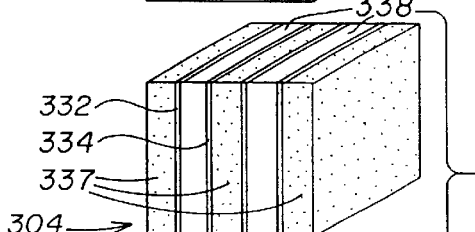
FIG. 11D
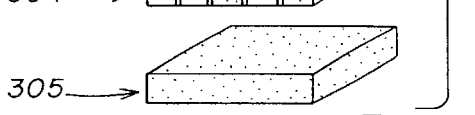
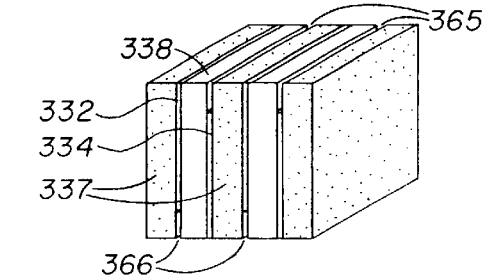
FIG. 11E
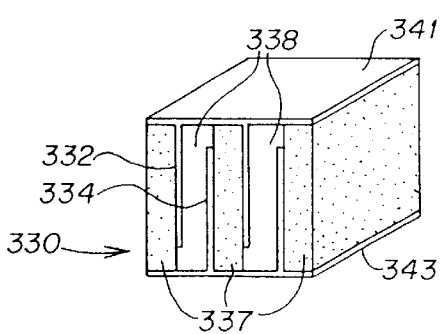
FIG. 11F

US 6,467,140 B2

METHOD OF MAKING COMPOSITE PIEZOELECTRIC TRANSDUCER ARRAYS

CROSS REFERENCE TO RELATED APPLICATIONS

This is a divisional of application Ser. No. 08/292,634 filed on Aug. 18, 1994 U.S. Pat. No. 6,225,728.

FIELD OF THE INVENTION

This invention relates to transducer elements used in transducer arrays, such as linear arrays, phased arrays, and two-dimensional arrays, and more particularly to a composite piezoelectric transducer element having a good match of both acoustical impedance with the body and electrical impedance with the imaging system.

BACKGROUND OF THE INVENTION

Acoustic transducers for medical ultrasonic imaging are made of piezoelectric materials. A variety of composite materials are made by combining a piezoelectric ceramic with a passive polymer phase. These composite materials extend the range of material properties offered by conventional piezoelectric ceramics and polymers.

In pulse-echo medical ultrasonic imaging, a 1–3 composite geometry has been identified as the most promising. W. A. Smith, "Composite Piezoelectric Materials For Ultrasonic Imaging Transducers—A Review," 1986 IEEE, CH2358-0/86/0000/0249, pages 249–255. For example, the 1–3 PZT rod-polymer composite structure 10 shown in FIG. 1 consists of a polymer matrix 11 which holds together thin parallel rods 12 of piezoelectric ceramic oriented perpendicular to opposing faces 13, 14 of the plate. Metal electrodes are applied to the faces 13, 14. When a voltage pulse is applied across this plate (in the direction "t"—same as the poling direction) it excites thickness-mode oscillations in the plate in a band of frequencies near the fundamental thickness resonance of the plate. The resulting acoustic vibrations 15 are projected into the soft tissues of the human body where they scatter off organ boundaries and structures within those organs. Echos returning to the transmitting transducer excite thickness oscillations in the piezoelectric plate, which generate an electronic signal used for making an image. By scanning the direction of the interrogating beam and properly interpreting the returning echos, a picture of the interior of the body is produced having substantial diagnostic value to the physician. Smith at p. 249.

Important parameters for a successful piezo material in this application include: sensitivity; acoustical and electrical impedance matching; low electrical and mechanical losses; shapability; thermal stability and structural strength. For good sensitivity, the piezoelectric must efficiently convert between electrical and mechanical energy, so that the electromechanical coupling is high. The piezoelectric must be acoustically matched to the tissue so that the acoustic waves in the transducer and the tissue couple well during both transmission and reception. Each of the array elements electric impedance must be compatible with the driving and receiving electronics, which is usually 50 ohms. For a given geometry of an array element, the electrical impedance is inversely proportional to the dielectric constant of the piezoelectric material. Thus, the dielectric constant must be relatively large. In summary, a good piezoelectric material for medical ultrasonic imaging should have: high electro-mechanical coupling (k approaching 1); acoustic impedance close to that of the tissue (Z approaching 1.5 Mrayls); reasonably large dielectric constant ($\epsilon \geq 100$); and low electrical (tan $\delta \leq 0.10$) and mechanical ($Q_m \geq 10$) losses. See Smith at p. 249.

The performance of a composite piezoceramic varies with the volume fraction of piezoceramic for a given ceramic and polymer. Generally, a trade-off is made between lowering the acoustic impedance and obtaining a high coupling as the volume fraction decreases. Nevertheless, there is a broad range of proportions over which the composite's coupling coefficient is higher and its acoustic impedance lower than those of a pure piezoceramic component. Smith at p. 253.

Transducer arrays have been made from composites, as shown for example in FIG. 2. A composite linear array 20 has rectangular ceramic rods 21 embedded in a polymer matrix 22, with metal electrodes 23, 24 on opposed major surfaces of the composite 27, a matching layer 25 on one major surface for placement adjacent the body, and array elements 26 defined by an electrode pattern on the second major surface. Alternatively, arrays can be made by cutting the composite to isolate array elements. Composites can be made quite flexible, enabling formation into curved shapes for beam focusing and steering.

A second article by W. A. Smith, "New Opportunities In Ultrasonic Transducers Emerging From Innovations In Piezoelectric Materials," 1992 SPIE International Ultrasonics Symposium (Jul. 21–22, 1992), summarizes the material parameters for various piezoceramic (Table I) and piezopolymer (Table II) materials. Smith also defines a relationship between the three-axis. coordinate system and the polar axis of the ceramic, in order to define the independent material parameters (pages 2–3). These relationships define the electro-mechanical coupling factors, i.e., $k_{31}$, $k_{33}$, . . . which measure the true strength of the piezoelectric interaction once the elastic and dielectric response of the medium are normalized out. Known values for the coupling coefficients, as well as the other important material parameters, are listed for some of the major piezoelectric ceramic materials such as barium titanate, lead zirconate titanate, and modified lead titanate, as well as piezopolymers such as polyvinylidene difluoride and its copolymer with trifluoroethylene.

FIG. 3 illustrates schematically three of the various types of composite piezoelectric materials. The composite types are referred to by the connectivity pattern of the individual phases. For example, a 1–3 connectivity refers to a composite with a piezoelectric phase continuous or self-connected in one dimension and a polymer phase self-connected in three dimensions. FIG. 3A shows the 1–3 PZT rods in a polymer structure 30, as previously discussed in regard to FIGS. 1–2. FIG. 3B illustrates a layered 2—2 structure 40, comprising alternating layers of piezoceramic and polymer, wherein electrodes are placed on the opposing top and bottom surfaces. FIG. 3C illustrates a 3—3 composite structure 50, comprising a blend of piezoceramic and polymer. Each of these structures has advantages in different applications. In general, a device structure having a low Q is desired, which is best achieved by efficiently coupling the transducer acoustically to the medium and electrically to the excitation and imaging electronics.

The polymer in each of the FIG. 3 composite structures helps lower the acoustic impedance for a better match with the medium. However, there is still a problem in achieving a good match of electrical impedance. In this regard, it has been proposed to provide a structure of piezoceramic strips interlaced with metal electrodes as shown in FIG. 4B, which is taken from R. Goldberg and Smith, "Performance of Multi-Layer 2-D Transducer Arrays," 1993 Ultrasonic Symposium, 1051-10117-93-0000-1103, IEEE (1993), pages 1103–1106. For comparison purposes, a single layer ceramic element 60 is shown in FIG. 4A, and a multi-layer ceramic element 70 of the same overall dimensions in FIG. 4B, wherein the arrows (61, 71) indicate the poling direction. The stated objective in Goldberg et al. is to use multi-layer ceramics to increase both the transmit and receive sensitivity of a 2-D array element. In the transmit mode, the goal is to increase the acoustic output power into the body tissue for a given source voltage, which is accomplished by matching the electrical impedances of the source and the transducer for maximum power transfer. In the receive mode, the goal is to increase the received voltage that is amplified and processed by the ultrasound imaging system; the received voltage is increased by having a matched transducer impedance relative to the coaxial cable and imaging circuitry. In the Goldberg et al. multilayer structure 70, the ceramic layers 72 (between interlaced electrodes 73) are connected electrically in parallel, and the total clamped capacitance is the sum of the capacitance of each layer. Therefore, the capacitance $C_N$ of an N layer transducer with an electrode area A, layer thickness t/N, and dielectric constant $\epsilon$ is:

$$C_N = N \cdot \epsilon A/(t/N) = N^2 \cdot C_{single}$$

where $C_{single}$ is the capacitance of a single layer transducer (such as element 60 in FIG. 4A having a single ceramic layer 62 between electrodes 63, 64). As described in Goldberg et al., the open-circuit receive sensitivity is directly proportional to the layer thickness t/N, and as a result increasing the number of layers will decrease the open-circuit sensitivity. However, the authors state that the multilayer ceramic structure's ability to drive an electrical load compensates for the decreased open-circuit sensitivity.

While the multilayer ceramic structure of Goldberg et al. lowers the electrical impedance of an array element for better power transfer with the imaging system, it does not solve the problem of acoustic matching. Furthermore, while 2-D arrays are desirable in providing elements along the azimuth and elevation planes to provide dynamic control of the ultrasound beam in both directions, the smaller size of the array elements increases the electrical impedance, and thus exacerbates the problem of poor transducer sensitivity. Thus, none of the prior art systems effectively provide both a good match of acoustical impedance to the medium being observed, and a good match of electrical impedance of the imaging system, especially for extremely small transducer elements as required in phased arrays and 2-D matrix arrays.

Two-dimensional arrays consist of tiny transducer elements distributed in a square lattice in two dimensions. One of the major problems in 2-D arrays is that element sizes are very tiny which results in extremely large electrical impedance. Even in current phased array elements, the electrical impedance ranges from a couple of hundred ohms to larger than a kilo ohm depending on the frequency and aperture of the elements. In a 2-D array each one of these elements are subdivided into 64 or larger number of elements in the elevation direction. Thus, the impedance of each of the 2-D array elements is at least 64 times larger and makes it difficult to couple the electrical energy from the typically 50 ohm imaging system to the transducer. The present invention solves this electrical impedance problem along with optimizing the acoustic impedance match to the human body.

SUMMARY OF THE INVENTION

The present invention is directed to a new composite structure providing thin wafers of piezoceramic which are electroded on opposing major first and second surfaces and polarized along the thickness between the electrodes. The wafers are spaced apart by a layer of passive polymer. An element includes at least two electroded ceramic wafers and an intermediate passive polymer layer. The piezoelectric wafers are driven electrically along the wafer thickness to generate acoustic vibration in the perpendicular direction (see FIG. 7). This mode of vibration is referred to as transverse '31' mode. By providing a large electrode area on the major surfaces of the ceramic wafer, and a relatively small wafer thickness, the resulting capacitance for each element is increased and the corresponding electrical impedance is reduced. The elements can be provided in a 2—2 or 3–1 composite structure. The number of wafers in a given element can be selected to provide a desired impedance match. In a linear or phased array, there may be hundreds of wafers provided in a strip. In a 2-D array, a plurality of such elements can be provided in a square lattice in two dimensions. The ceramic wafers interspersed with polymer layers results in a low acoustic impedance composite structure. Thus, both electrical impedance and acoustic impedance are optimized for tiny array elements.

Another aspect of the present invention are various methods of making the composite structure. In a first method, wafers of piezoelectric ceramic are electroded along their major surfaces and polarized along the thickness. The wafers are stacked with spacers along one edge to build a stack of tens or hundreds of wafers, depending on the desired application. The stack is then cast in an epoxy polymer matrix. The area containing the spacers is trimmed away to provide the composite structure. If the original surface electrodes extend to the edges of the element,. channels are cut into the composite at regular intervals along opposite edges and the channels are then filled with polymer. End electrodes are provided on the top and bottom surfaces of the element respectively, each connected to a different one of the two sets of surface electrodes. Alternatively, the surface electrodes may be originally applied for example, by masking, such that they do not extend to the opposing edge, in which case channels are not-required.

A further alternative method of preparation is to start with a piezoceramic block and to dice grooves with a diamond saw blade to form a series of spaced parallel piezoceramic wafers. The wafers are then electroded and the grooves filled with epoxy. A bottom piezoceramic layer is cut off to produce a composite structure. Again channels are cut on opposing surfaces to provide two sets of opposing surface electrodes, the channels filled with polymer, and end electrodes applied.

These and other advantages of the present invention will be more specifically described in the following detailed description and drawings.

BRIEF DESCRIPTION OF THE DRAWINGS

FIGS. 11A–11F illustrate a third method of making according to this invention;

DETAILED DESCRIPTION

Figure 1:
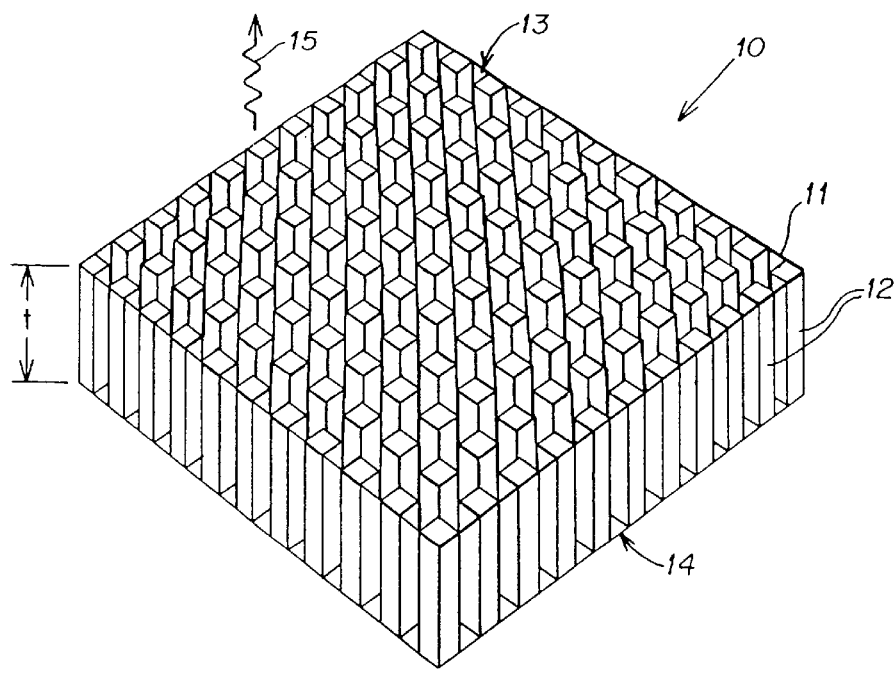
FIG. 1 is a schematic view of a prior art 1–3 rod-polymer composite structure.
Figure 2:
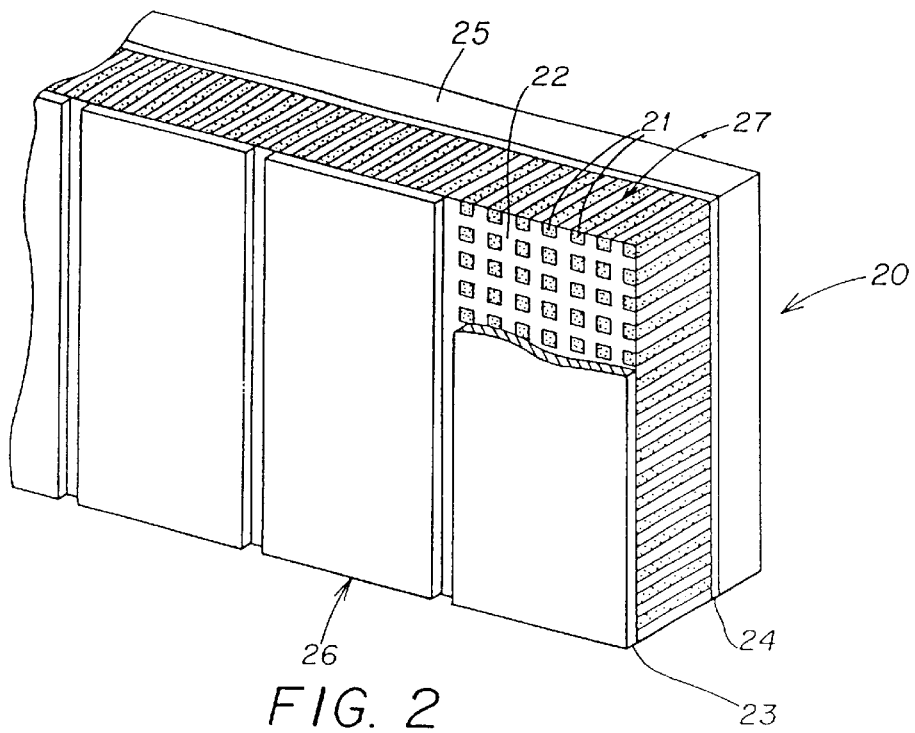
FIG. 2 is a schematic view of a prior art linear array formed from the 1–3 rod-polymer composite transducers of FIG. 1.
Figures 3A, 3B, 3C:
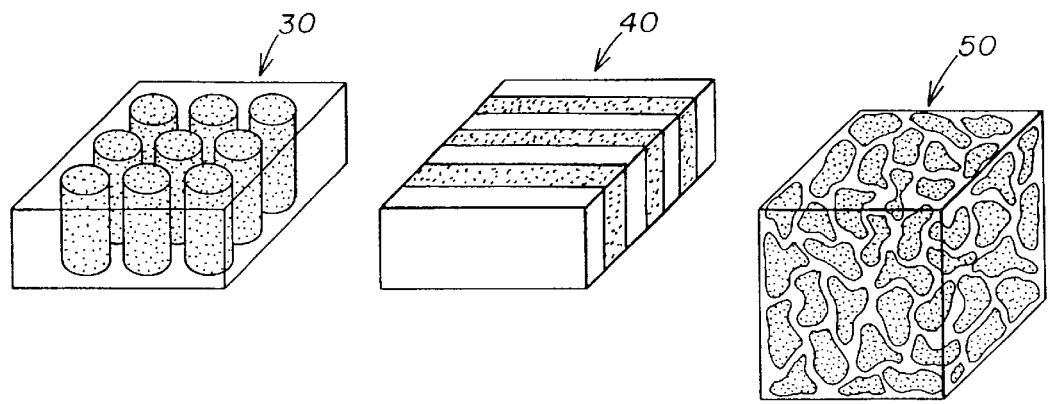
FIG. 3 contains illustrative views of three different prior art composite structures: 1–3 rods in a polymer (3A); 2—2 layer composite (3B); and 3—3 block composite (3C)
Figures 4A, 4B:
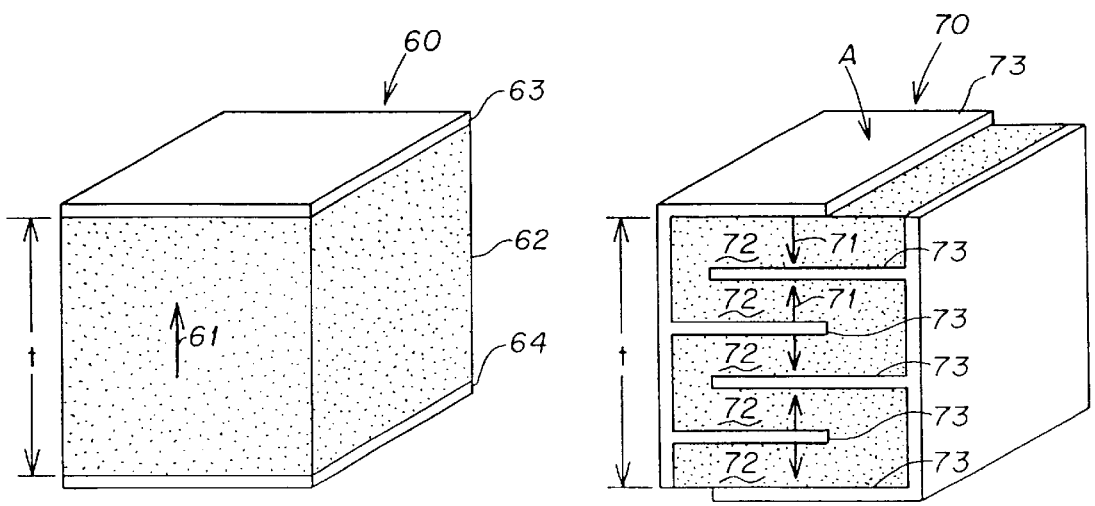
FIG. 4 shows schematic views of a prior art single piezoceramic element (4A) and a prior art interlaced electrode piezoceramic element (4B)
Figure 5A:
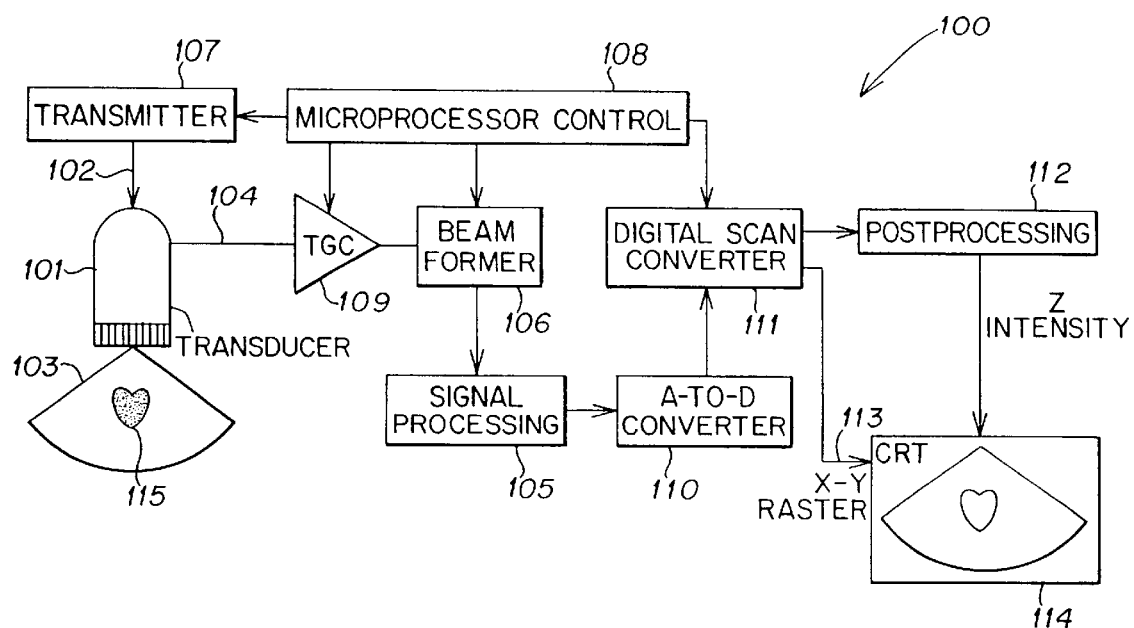
FIG. 5A is a block diagram of an ultrasound imaging system using a phased array, with FIG. 5B illustrating how the transducer is electrically coupled to the imaging system and acoustically coupled to the patient.

A block diagram of a phased-array, pulse-echo ultrasound imaging system 100 is. shown in FIG. 5A. The system provides a pulsed electrical stimulus to an array of transducers 101, which causes the transducers to transmit an ultrasonic acoustical wave 103. The wave is transmitted into a medium, such as a human body, and eventually, at least partially reflected by an object (e.g., heart 115) in the medium. The reflected wave (the "echo") is received by the transducers 101, which produce an electrical signal 104 that is indicative of the echo. Various properties of the electrical signal caused by the echo, such as its amplitude and phase, are then analyzed by a signal processing section of the imaging system to determine information about the object, such as its size, location, and velocity. The imaging system may use beam steering, phased array, or other techniques known in the art to stimulate the transducers and to analyze the electrical signal resulting from the echo, see e.g., U.S. Pat. No. 5,060,651 entitled "Ultrasonic Diagnostic Apparatus."

More specifically, FIG. 5A shows a microprocessor 108 for controlling each of a transmitter 107, preamplifier 109, beam former 106, and digital scan converter 111. The echo signal 104 from transducer array 101 is sent to preamplifier 109 which amplifies the same, and then in series to beam former 106, signal processor 105, A-D converter 110, and digital scan converter 111. The z component is sent to post-processor 112, and the resulting z intensity is displayed on CRT screen 114. The x-y component is sent via x-y raster 113 and displayed on CRT screen 114. Any number of different transmitting and imaging processing systems may be used.

Figure 5B:
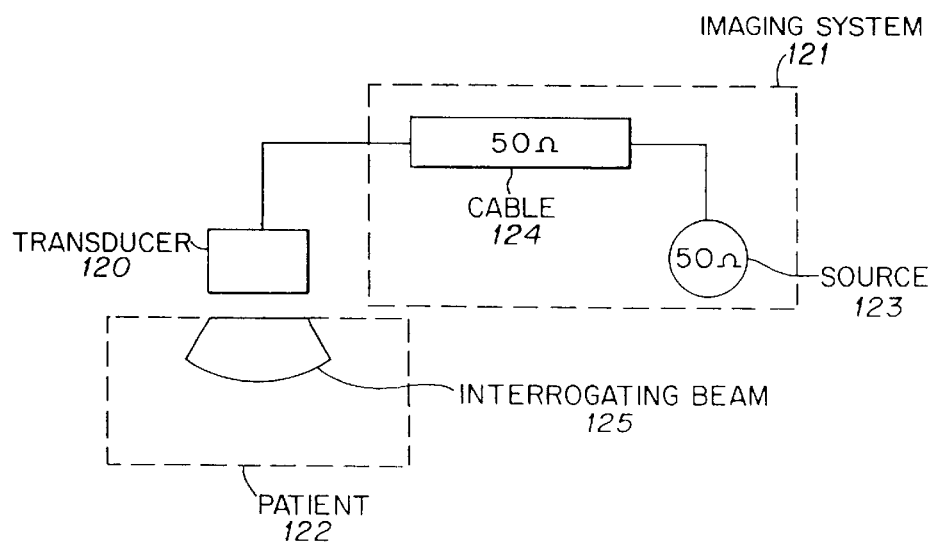

FIG. 5B illustrates in simplified form how a transducer 120 is electrically coupled to an imaging system 121 at one side, and acoustically coupled to the medium (a patient 122) at another side. The imaging system may for example include a source 123 with an approximate electrical impedance of 50 ohms in series with a cable 124 having a 50 ohm impedance. The condition of maximum power transfer to the load (patient 122) occurs when the source and cable impedances and transducer impedance are substantially identical.

In a receive mode (not shown), the incident acoustic pressure can be modeled as a voltage source, while the transducer impedance becomes the source impedance. The electrical load consists of the shunt capacitance of the cable and the preamplifier input impedance. The transducer can drive the cable load effectively when the transducer capacitance is much greater than the cable capacitance. The composite element of the present invention satisfies these requirements.

Figure 6:
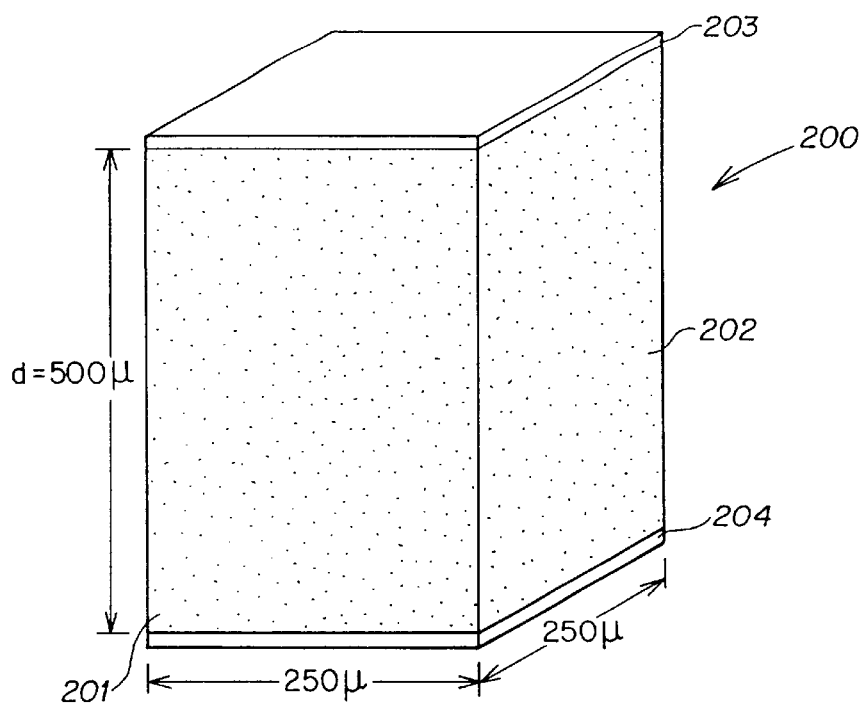
FIG. 6 is a schematic diagram of a prior art, square cross-section transducer element for use in 2-D arrays for illustrating the poor impedance match.

The capacitance of a given structure is determined by its configuration. For example, a parallel plate capacitor has a capacitance "C":

$$C=\epsilon_o KA/d$$

where K is the relative dielectric constant, $\epsilon_o$ is the permittivity of free space ($8.85\times10^{-12}$ farads/meter), A is the area facing the parallel plates, and d is the distance between the plates. For a typical prior art transducer element 200 used in 2-D arrays, such as shown in FIG. 6, a parallel plate capacitor is an appropriate model. Transducer element 200 has a square cross section, 250 microns ($\mu$) on each of two sides 201, 202, and a height d between opposing electrodes 203, 204 of approximately 500 microns. If such an element is formed from PZT ceramic having a relative dielectric constant=3000, then $A=250\times250\mu^2$, $d=500\mu$, and the capacitance of the transducer will be approximately 3.3 pico farads (pF). Consequently, this prior art transducer provides a poor electrical match to the cable capacitance of 200 pf (i.e. the cable connecting the transducer to the preamplifier).

Figure 7:
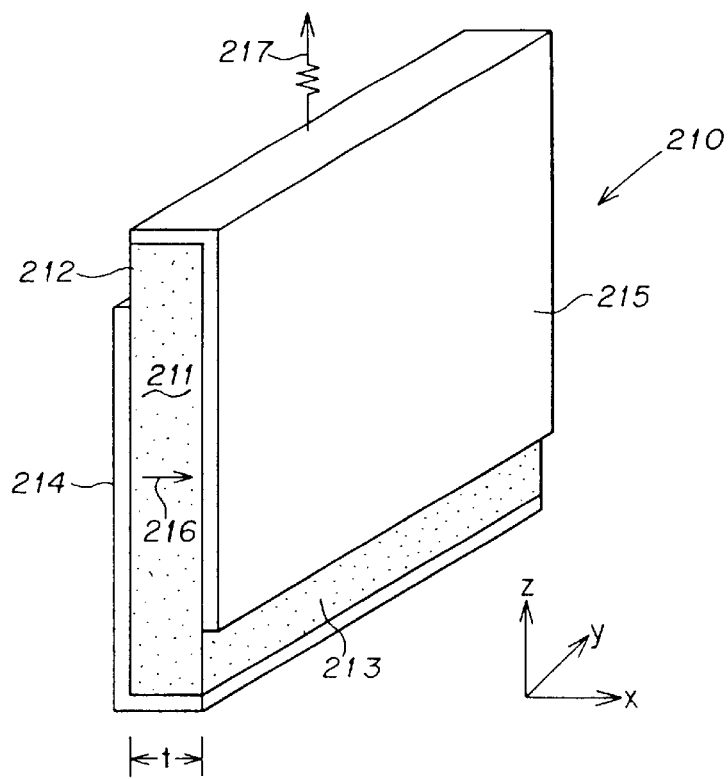
FIG. 7 is a schematic diagram of the composite transducer element of this invention, having a substantially improved impedance match.

In contrast, a first embodiment of the present invention utilizes a 2—2 composite structure wherein a plurality of wafer elements 210 (see FIG. 7) are sandwiched between polymer layers to form a composite element 230 (see FIG. 8). FIG. 7 shows one relatively thin PZT wafer 211, having a thickness t (in the x direction), and major opposing surfaces 212, 213 (in the y-z plane) each with a relatively large area A. The major opposing surfaces are electroded 214, 215 over a majority of their large surface area, and the wafer is poled across the thickness (in the x direction as shown by arrow 216). The resulting acoustic output signal 217 is in the z direction. As a result, the capacitance of this wafer element is relatively large because of the large electrode area and relatively small thickness t. Furthermore, when a plurality of these wafers are electrically connected in parallel, their capacitance is summed, producing a large capacitance and correspondingly small electrical impedance for improved matching with the imaging system. The relative dimensions and number of the elements can vary; preferably the thickness, area and number of elements are selected to provide an impedance of each element of about 50 ohms.

Figure 8A:
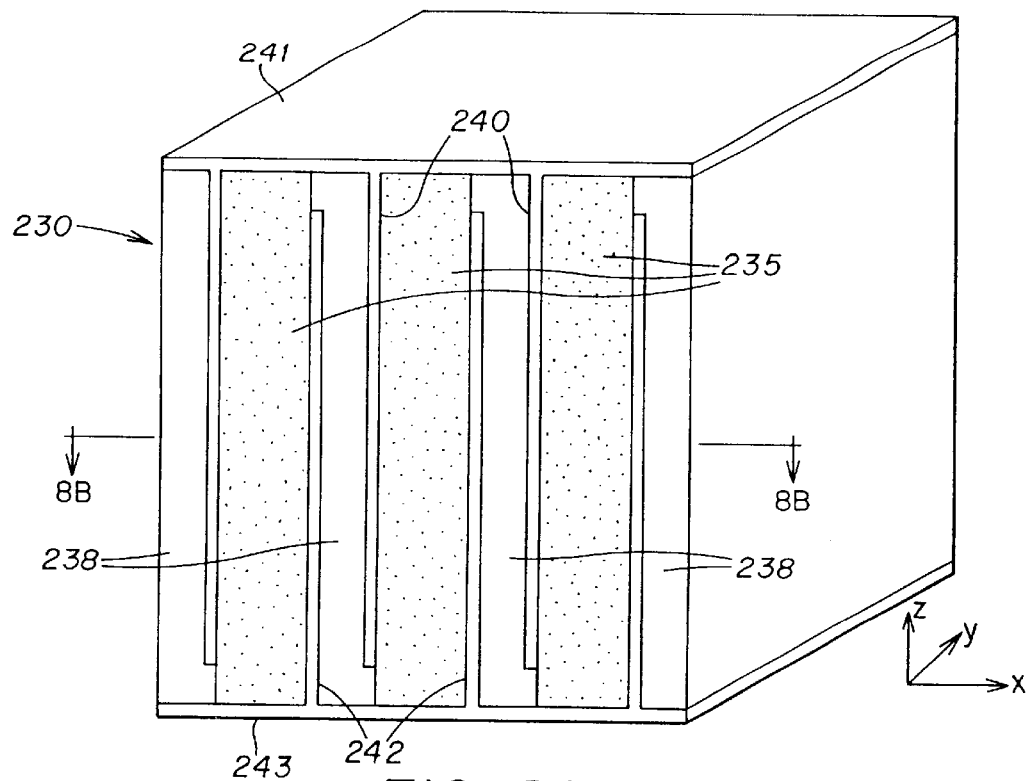
FIGS. 8A–8B are perspective and cross sectional views respectively of a 2—2 composite transducer structure according to this invention.
Figure 8B:
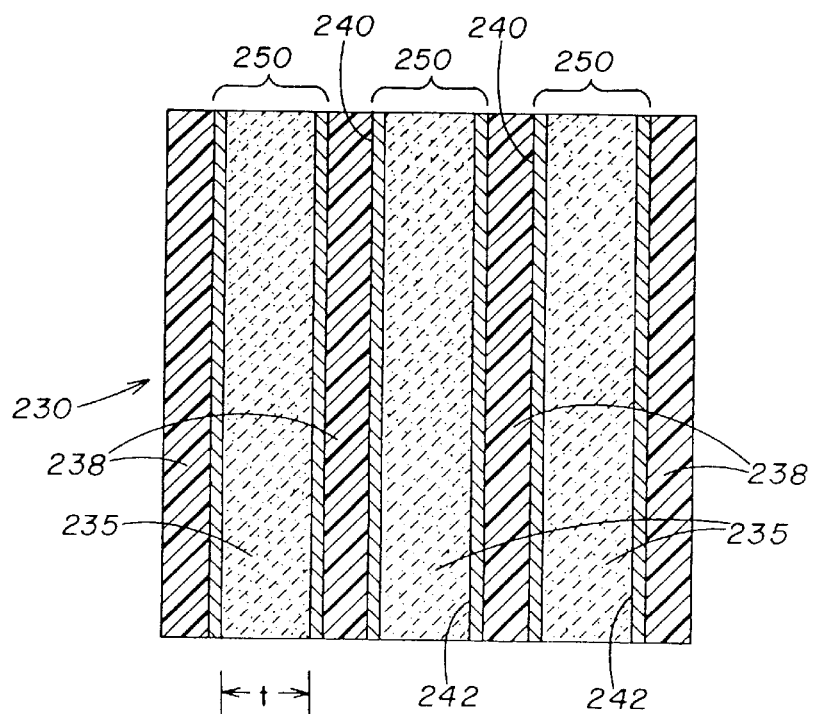

FIGS. 8A–B illustrate front perspective and cross-sectional views respectively of the composite 2—2 transducer 230 of this invention. Flat wafers or strips 235 of piezoelectric ceramic, such as PZT, are sandwiched between a first electrode layer 240 on one side and a second electrode layer 242 on the other side. The electrodes extend along the major surfaces of the wafers, in the y-z plane. Each set of electrodes 240, 242 is connected to a different one of end electrodes 241, 243 at opposing top and bottom surfaces of the composite. Thus, as shown in FIG. 8A, upwardly-depending electrodes 240 are connected to top end electrode 241, and terminate short of the bottom electrode 243. Similarly, downwardly-extending electrodes 242 connect to bottom electrode 243, and end short of the top electrode 241. A layer of passive polymer 238, for improved acoustical matching with the body, is provided between each adjacent set of electroded wafers 240/235/242.

The wafers 235 are polarized across their thickness in the x direction and are stimulated with an electrical pulse along the same direction. As such, the wafers 235 are driven using the $k_{31}$ coupling of the PZT material, and resonance occurs along the z direction.

Each combination 250 of an electrode 240, wafer 235, and electrode 242 may be modeled as a parallel plate capacitor. Moreover, the arrangement of FIGS. 8A–8B define a plurality of such capacitors connected in parallel. Thus, the overall capacitance of the composite 230 is the sum of the individual capacitance for each combination 250. Because each combination 250 provides a relatively large electrode surface area and a relatively small distance t between electrodes, each combination 250 has a relatively high capacitance.

As previously discussed, the prior art transducer of FIG. 6 has a capacitance of approximately 3.3 pf. In contrast, the composite 230 of this invention having a PZT wafer 235 that is 50 microns wide, sandwiched between electrodes 240 and 242, will exhibit approximately 66 pf of capacitance per combination 250. Moreover, if 25 micron thick polymer layers 238 separate the combinations 250, three such combinations connected in parallel will fit in the same volume as the prior art transducer. Consequently, the transducer 230 will exhibit a total capacitance of approximately 198 pf.

Figure 9A:
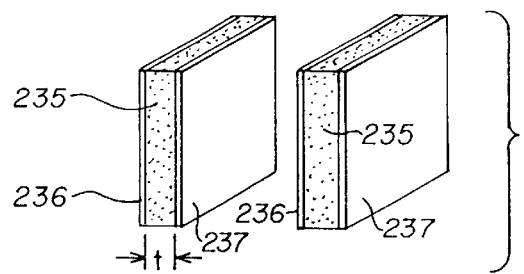
FIGS. 9A–9G illustrate a first method of making according to this invention.
Figure 9B:
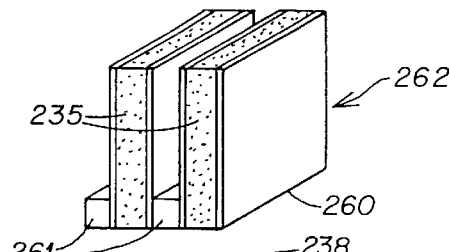
Figure 9C:
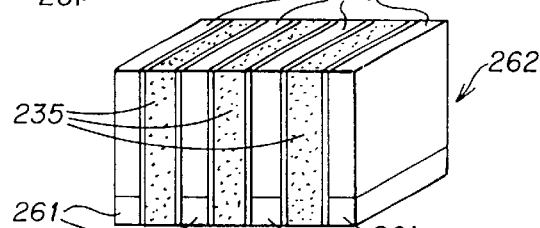
Figure 9D:
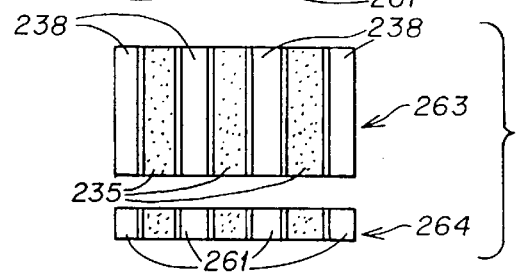
Figure 9E:
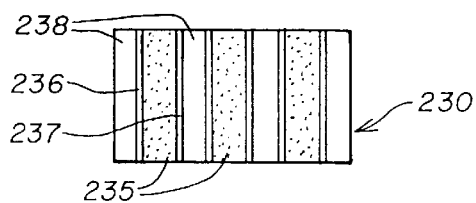
Figure 9F:
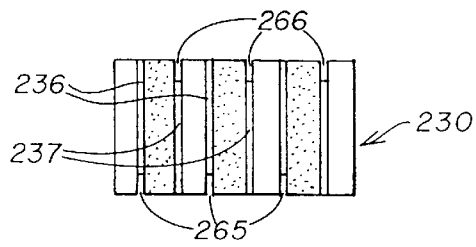
Figure 9G:
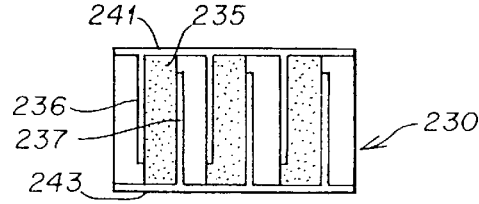

FIGS. 9A–9G illustrate one method of forming a composite element 230. Wafers 235 of PZT material are electroplated (or electrodes applied by other means) on their opposing major surfaces 236 and 237 (see FIG. 9A). Each wafer may be 50 microns thick, for example. The wafers 235 are polarized (i.e., poled) along the thickness t so that the PZT exhibits piezoelectric properties. The electroded wafers are then stacked with spacers 261 at lower edge 260, thus separating the major surfaces 236 and 237 of adjacent wafers (see FIG. 9B). Each spacer 261 may be 25 microns thick, for example. The number of wafers that are stacked depends upon the application, but the stack 262 may include tens or hundreds of such wafers, if necessary. The entire stack 262 is then cast in an epoxy matrix, forming polymer layers 238 which fill the spaces between the ceramic wafers 235 (see FIG. 9C). A bottom portion 264 of the stack which includes the spacers is trimmed away by a diamond saw blade, as shown in FIG. 9D. The polymer filled stack 263 is then cut into transverse sections of transducer elements 230 (FIG. 9E) of the appropriate size. The transducer elements 230 are ground, with a dicing saw for example, to form channels 265, 266 in opposing ends of electrodes 236, 237, respectively. These channels are necessary so that electrodes 236, 237 will not be in electrical connection, when end surfaces 241, 243 are electroded, as described below. The channels may extend for 25 microns, for example, as shown in FIG. 9F. The channels 265, 266 are filled with polymer 238, and the opposing transverse surfaces 241, 243 are electroded (see FIG. 9G). The transducers 230 are then arranged into 2-D arrays with techniques known in the art (see FIG. 12).

Figure 10A:
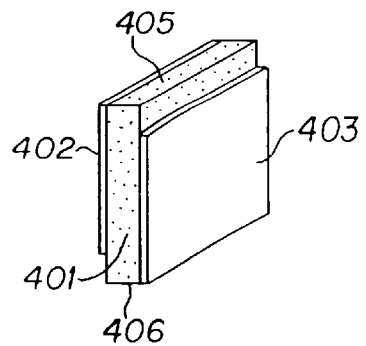
FIGS. 10A–10D illustrate a second method of making according to this invention;.
Figure 10B:
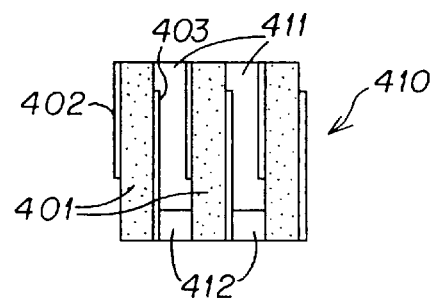
Figure 10C:
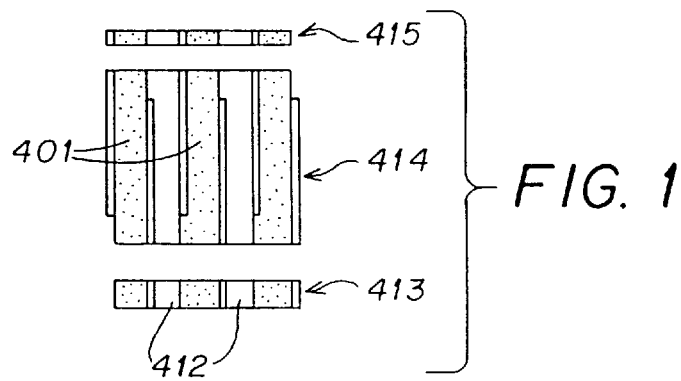
Figure 10D:
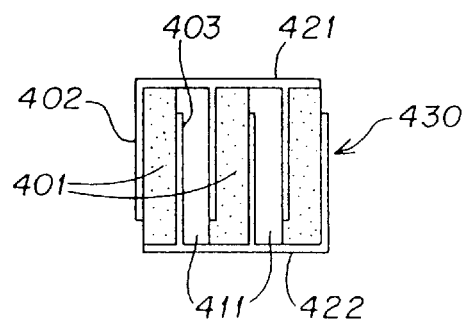

FIGS. 10A–10D illustrate another method of forming a composite element 430, in which the original electrodes extend over less than the entire surface of the wafer. As shown in FIG. 10A, a piezoceramic wafer 401 has opposing surface electrodes 402 and 403 extending over a substantial majority of the opposing surfaces, but terminating short of opposing top and bottom end surfaces 405, 406. In FIG. 10B, a plurality of such elements are placed in spaced relation by a series of spacers 412 along one edge, and the areas between the wafers are filled with polymer to form polymer layers 411 in composite block 410. A bottom portion 413 including the spacers is cut off, and a top portion 412 is lapped off as shown in FIG. 10C, exposing the opposing sets of electrodes 402, 403 on the central portion 414. In FIG. 10D, upper and lower electrodes 421 and 422 are applied to the top and bottom of the composite to form the finished transducer element 430.

A further alternative method of producing a composite 330 is shown in FIGS. 11A–11F. A PZT block 300 is diced to form elongated parallel channels 336 (FIG. 11B), by for example a diamond saw. The channels 336 separate extending rectangular projections or wafers 337, which are joined along one common edge 339. The upper surface of the element including side surfaces of each projection 337 are covered with electrodes 332, 334, by for example sputtering or vacuum deposition (FIG. 11C). The resulting structure 302 is then coated and filled with polymer to form polymer layers 338 and a bottom PZT-only portion 305 is removed (FIG. 11D). Again, channels 365, 366 are cut to remove opposing ends of electrodes 337A, 337B in the top and bottom surfaces, the channels are filled with polymer, and end electrodes 341, 343 are applied to the top and bottom surfaces of resulting structure 330 (FIG. 11F).

Figure 12:
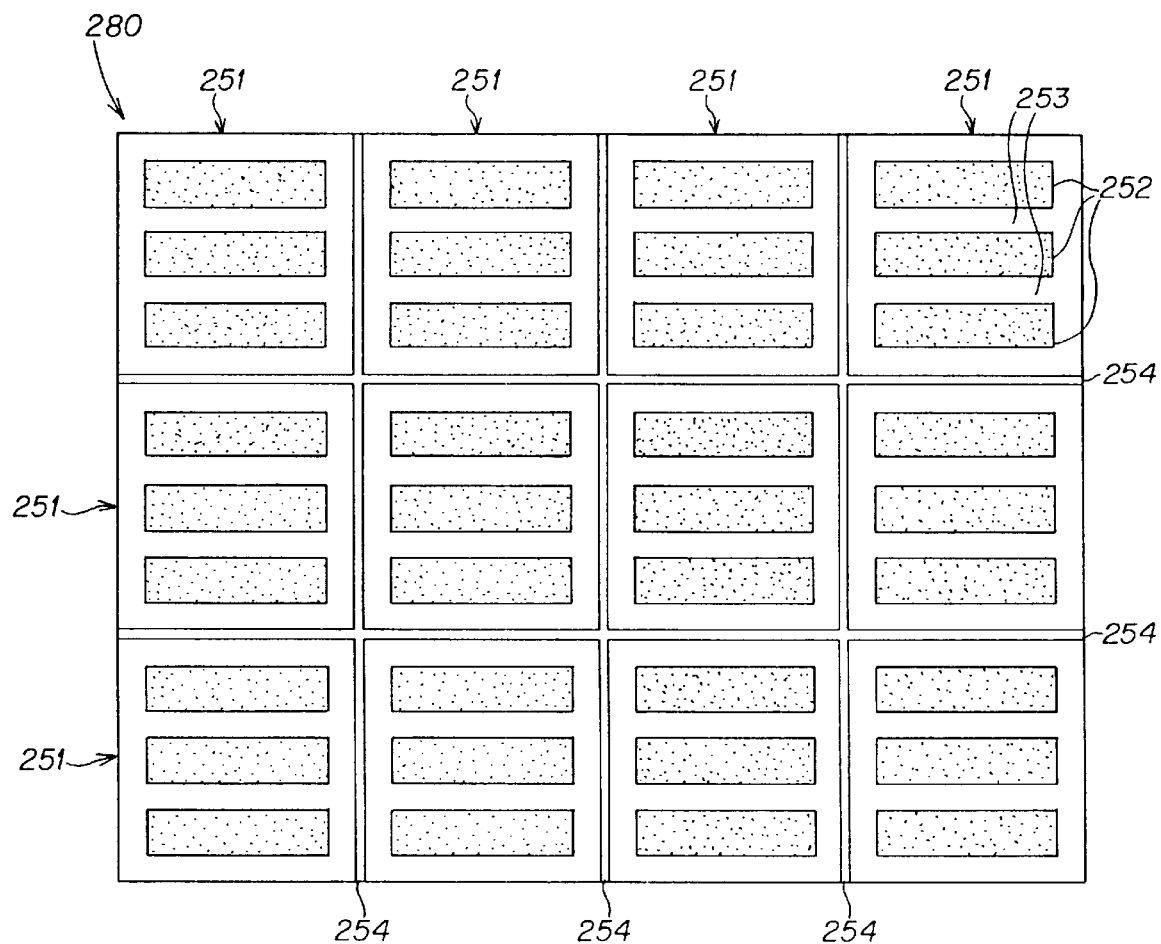
FIG. 12 is a top plan view of a 3×4 two-dimensional array of composite transducer elements of this invention.

In a preferred embodiment, the transducer elements 230 (330 or 430) are formed into a 2-D array 250 as shown in FIG. 12. Each array element 251 has three piezoelectric wafers 252, separated by polymer layers 253. The separate elements 251 (separated by scribed electrodes 254) are formed into a 4×3 rectangular array.

Figure 13A:
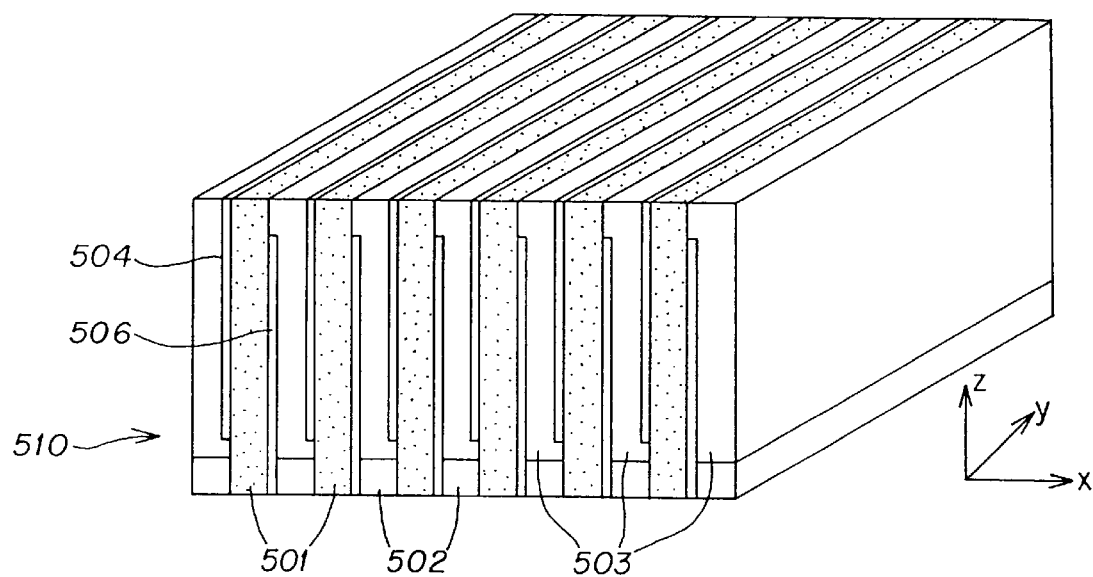
FIGS. 13A–13B illustrate a further method of making an alternative 1–3 composite transducer structure according to this invention.
Figure 13B:
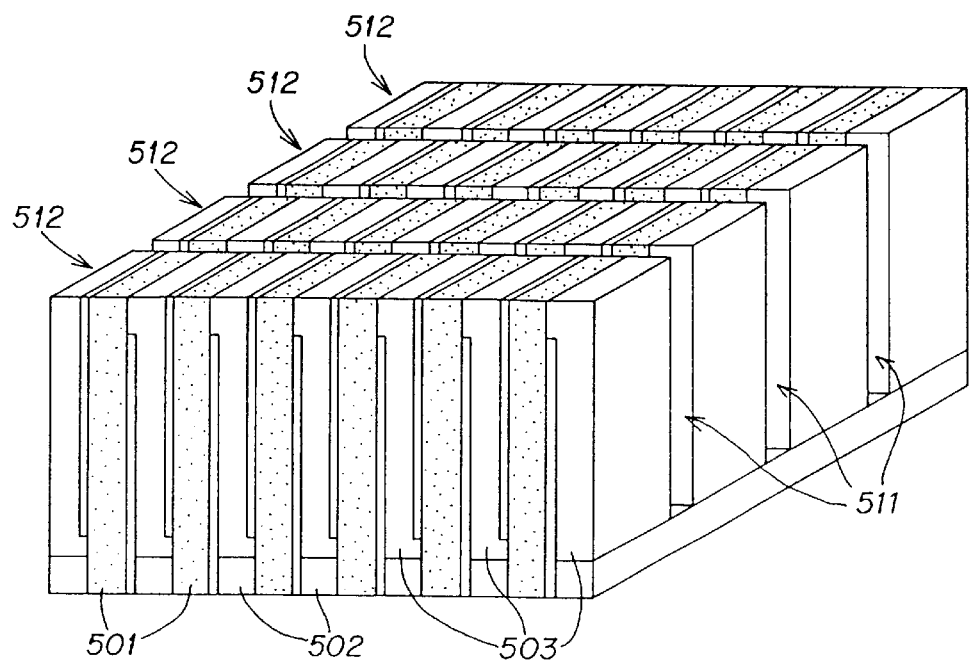
Figure 14A:
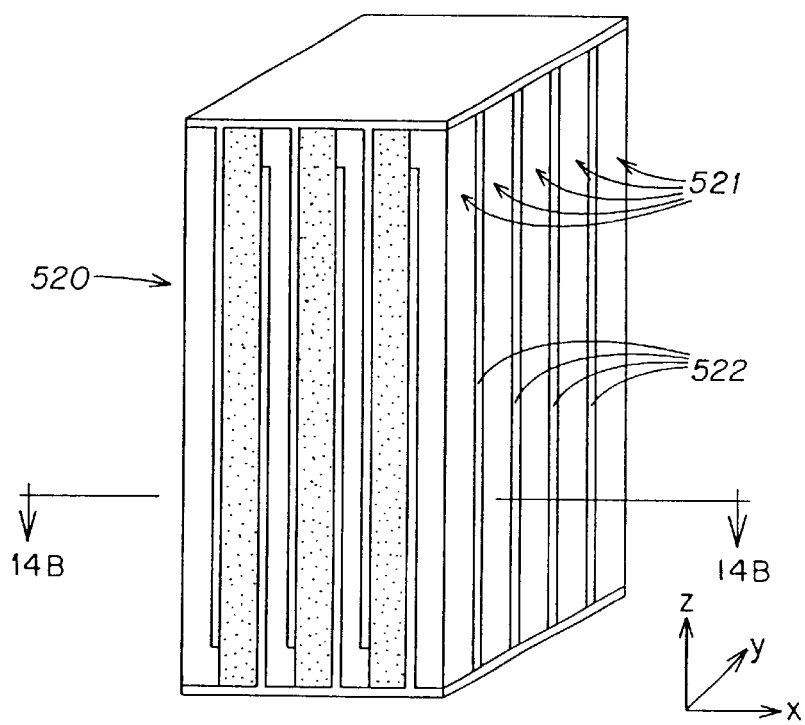
FIGS. 14A–14B illustrate the alternative 1–3 composite transducer structure.
Figure 14B:
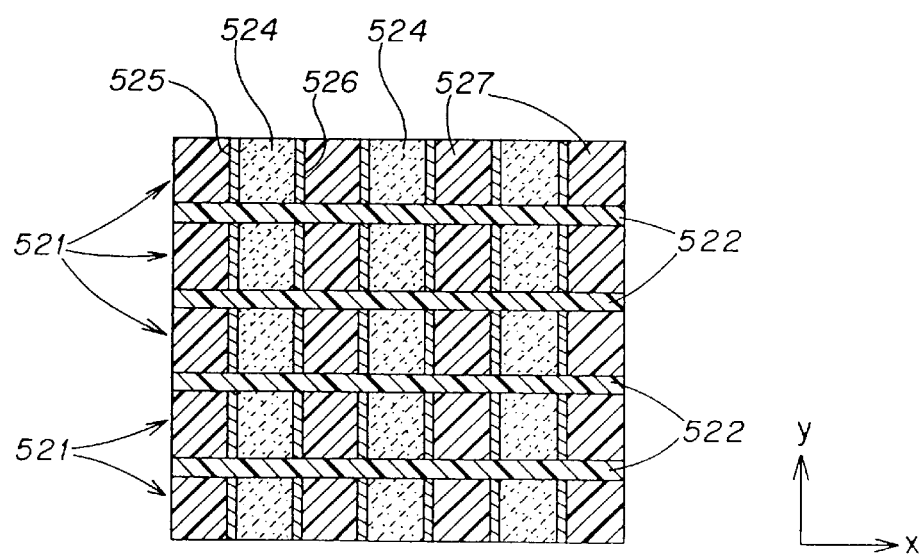

In a further alternative embodiment, a 1–3 composite structure is provided designed to be driven in a $k_{31}$ transverse mode. FIGS. 13A–13B show a method of making this alternative structure. In FIG. 13A, a composite block 510 is shown similar to the block 410 in FIG. 10B. The block 510 includes alternating layers of thin piezoceramic wafers 501 separated along one edge by spacers 502, and then polymer layers 503 between the piezoceramic wafers 501. Opposing electrodes 504, 506 are on the opposing surfaces of the ceramic wafers 501. As shown in FIG. 13B, transverse channels 511 are cut through the composite in the x-z plane, producing a series of parallel spaced elements 512. These channels 511 are then filled with epoxy, and one follows steps similar to those shown in FIGS. 10C–10D, including lapping off of the top surface, cutting off of the bottom portion with spacers, and application of top and bottom electrodes. The resulting 1–3 composite 520 is shown in FIGS. 14A–14B, including a plurality of spaced elements 521 separated by polymer layers 522. Each element 521 includes a plurality of thin rectangular rods 524 with electrodes 525, 526 on opposing surfaces, and separated by thin rectangular rods of polymer 527.

Having thus described certain embodiments of the invention, various modifications and improvements will readily occur to those skilled in the art. For example, various other piezoceramic materials are meant to be included in the term "piezoceramic," such as relaxor ferroelectric or electrostrictive materials such as lead magnesium niobate-lead titanate (PMN-PT). Accordingly, the foregoing description is by way of example only and the invention is defined as set forth in the following claims.

What is claimed is:

1. A method of making a medical ultrasound transducer element having an acoustical impedance substantially matching the acoustical impedance of the body, and an electrical impedance for efficient power transfer with an ultrasound imaging system, the method comprising:

preparing a 2—2 or 1–3 composite transducer element for driving in a $k_{31}$ transverse mode, the element having a plurality of relatively thin spaced piezoelectric wafers having relatively large area opposing major surfaces;

providing electrodes on the major surfaces for electrically connecting the wafers in parallel, wherein each of opposing sets of electrodes extend from a different one opposing end of the wafer to a distance spaced from the other end of the wafer;

providing a layer of passive polymer between the electrodes on adjacent wafers, which polymer is selected to provide an acoustic impedance substantially similar to the acoustic impedance of the body; and selecting a number of the spaced piezoelectric wafers to provide a transducer element having a reduced electrical impedance for improved power transfer with the imaging system.

2. A method of making a transducer comprising:

providing a plurality of relatively thin spaced piezoelectric wafers having relatively large area opposing major surfaces, and with opposing sets of electrodes on the opposing major surfaces;

stacking the electroded wafers with a predetermined space between adjacent electroded wafers to provide a stack, wherein a stacking element is provided between the wafers along one edge of the stack to define the predetermined space;

filling the stack with a polymer which fills in the spaces to provide a composite element;

removing a portion of the composite element including the stacking element; and providing electrodes on opposing end surfaces of the composite element, wherein each of the end electrodes connects to a different one of the opposing sets of electrodes.

3. The method of claim 2, wherein the opposing sets of electrodes are provided over all of the opposing major surfaces, and after the filling step, opposing sets of channels are cut in opposing ends of the opposing sets of electrodes, the channels are filled with polymer, and the end electrodes are provided.

4. A method of making a transducer comprising:

providing a plurality of relatively thin spaced piezoelectric wafers having relatively large area opposing major surfaces, and with opposing sets of electrodes on the opposing major surfaces;

stacking the electroded wafers with a predetermined space between adjacent electroded wafers to provide a stack;

filling the stack with a polymer which fills in the spaces to provide a composite element; and providing electrodes on opposing end surfaces of the composite element, wherein each of the end electrodes connects to a different one of the opposing sets of electrodes, and wherein each of the opposing sets of electrodes extend from a different one opposing end of the wafer to a distance spaced from the other end of the wafer.

5. A method of making a transducer comprising:

providing a plurality of relatively thin spaced piezoelectric wafers having relatively large area opposing major surfaces, and with opposing sets of electrodes on the opposing major surfaces;

stacking the electroded wafers with a predetermined space between adjacent electroded wafers to provide a stack;

filling the stack with a polymer which fills in the spaces to provide a composite element;

providing electrodes on opposing end surfaces of the composite element, wherein each of the end electrodes connects to a different one of the opposing sets of electrodes; and cutting a series of transverse spaced elongated channels through the stack and filling the channels with polymer to form an array of 1–3 composite elements.

* * * * *